(12) United States Patent
Galy et al.

(10) Patent No.: US 10,853,038 B2
(45) Date of Patent: Dec. 1, 2020

(54) DEVICE FOR GENERATING A RANDOM SIGNAL

(71) Applicant: STMicroelectronics SA, Montrouge (FR)

(72) Inventors: Philippe Galy, Le Touvet (FR); Thomas Bedecarrats, Saint Martin d'Hères (FR)

(73) Assignee: STMICROELECTRONICS SA, Montrouge (FR)

( * ) Notice: Subject to any disclaimer, the term of this patent is extended or adjusted under 35 U.S.C. 154(b) by 38 days.

(21) Appl. No.: 16/157,464

(22) Filed: Oct. 11, 2018

(65) Prior Publication Data

US 2019/0114145 A1 Apr. 18, 2019

(30) Foreign Application Priority Data

Oct. 12, 2017 (FR) ...................... 17 59547

(51) Int. Cl.
*G06F 7/58* (2006.01)
*H03K 3/012* (2006.01)
*H03K 3/84* (2006.01)
(52) U.S. Cl.
CPC ............. *G06F 7/588* (2013.01); *H03K 3/012* (2013.01); *H03K 3/84* (2013.01)

(58) Field of Classification Search
None
See application file for complete search history.

(56) References Cited

U.S. PATENT DOCUMENTS

| | | | |
|---|---|---|---|
| 2009/0327379 A1 | 12/2009 | Matsumoto et al. | |
| 2010/0005128 A1* | 1/2010 | Ergun | G06F 7/58 708/251 |
| 2010/0146025 A1 | 6/2010 | Ergun | |
| 2013/0141824 A1 | 6/2013 | Bourgeat et al. | |

FOREIGN PATENT DOCUMENTS

WO 2011089179 A1 7/2011

* cited by examiner

*Primary Examiner* — Michael D. Yaary
(74) *Attorney, Agent, or Firm* — Slater Matsil, LLP

(57) ABSTRACT

An integrated device, for generating a random signal, includes: a first terminal; a pulse signal generator configured to generate a current pulse train on the first terminal; and a first control circuit coupled to the first terminal and configured to convert the current pulse train into a voltage signal randomly including voltage pulses greater than a threshold, the random signal containing the voltage pulses greater than the threshold.

24 Claims, 3 Drawing Sheets

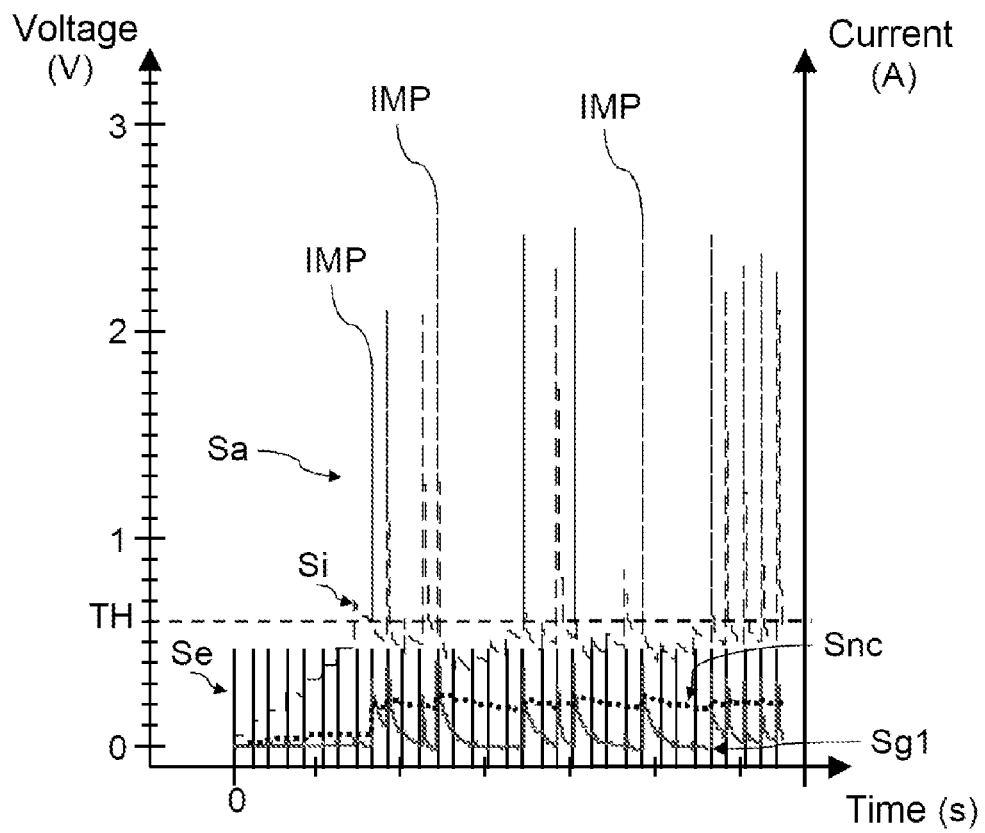
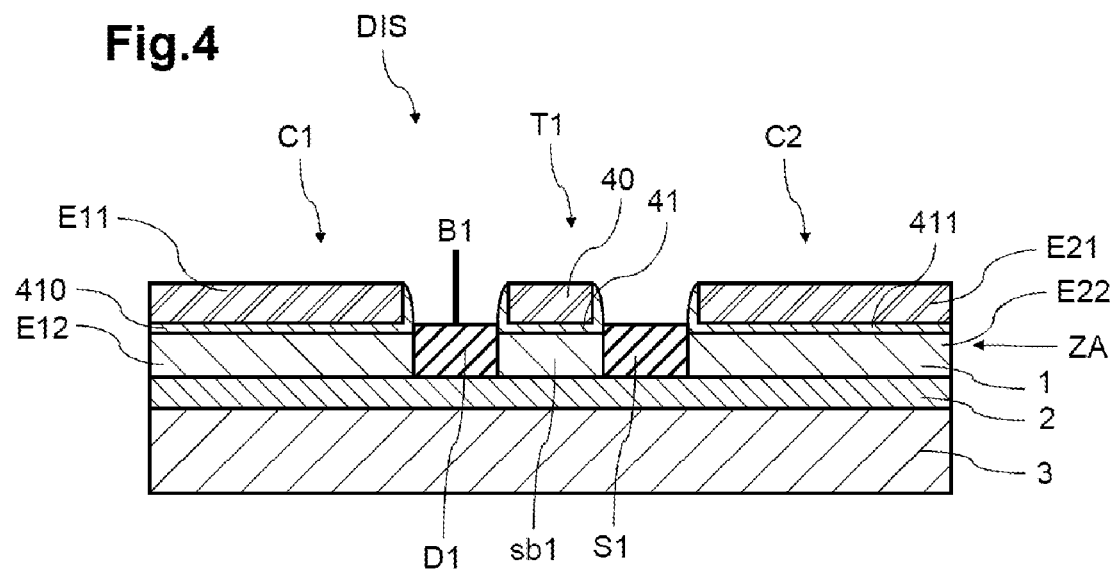

DEVICE FOR GENERATING A RANDOM SIGNAL

CROSS-REFERENCE TO RELATED APPLICATIONS

This application claims priority to French Patent Application No. 1759547, filed on Oct. 12, 2017, which application is hereby incorporated herein by reference.

TECHNICAL FIELD

Embodiments relate to integrated circuits, and in particular embodiments, to integrated circuits configured to generate random signals.

BACKGROUND

Traditionally, to generate random signals, there are solutions based on physical events, such as for example the avalanche effect. That being said, these solutions require operating voltages of several volts and are therefore not advantageous from an electrical power consumption point of view.

Other solutions use pseudorandom counters including flip-flops, but have the drawback of not being sufficiently random.

There is therefore a need to produce a random signal generator that has low power consumption and an improved random nature.

SUMMARY

Thus, according to one embodiment, what is proposed is a device that makes it possible to generate a signal having a strong random component and whose power consumption is low.

According to one aspect, what is proposed is an integrated device for generating a random signal, including a first terminal, a pulse signal generator configured to generate a current pulse train on the first terminal, and a first control circuit coupled to the first terminal and configured to convert the current pulses into a voltage signal randomly having pulses greater than a threshold, the random signal containing the voltage pulses greater than the threshold.

According to one embodiment, the device furthermore includes a supply terminal intended to receive a supply voltage, and the first control circuit includes a first MOS capacitor coupled between a first auxiliary supply terminal intended to deliver a first auxiliary voltage and the first terminal, and is configured to generate a voltage pulse greater than the threshold in the presence of a current pulse when it has reached its depletion regime, the first control circuit being able to charge and discharge the capacitor randomly.

The first auxiliary voltage terminal may be the supply terminal and, in this case, the first auxiliary voltage is the supply voltage.

According to one embodiment, the device includes a reference terminal intended to receive a reference voltage, and the first control circuit furthermore includes:

a main transistor coupled between the first terminal and a common node and whose substrate is coupled to the reference terminal by way of a second control circuit, on the one hand, and coupled directly to the gate of the main transistor, on the other hand;

a second capacitor coupled between the common node and a second auxiliary supply terminal intended to deliver a second auxiliary voltage;

a first secondary transistor coupled between the first terminal and the reference terminal and whose gate is coupled to the common node;

a second secondary transistor coupled between the supply terminal and the common node and whose gate is coupled to the gate of the main transistor; and a resistive element coupled between the common node and the reference terminal.

The second auxiliary voltage terminal may be the supply terminal and, in this case, the second auxiliary voltage is the reference voltage.

Such a circuit has very short reaction times, and makes it possible to create chaotic oscillations of the flows of electrons between the first capacitor and the second capacitor, through the main transistor. Depending on the charges of each capacitor at the instant of each pulse, the latter will or will not be absorbed by the first control circuit, or then integrated into a voltage pulse.

The term 'substrate', for a transistor, here and in the remainder of the description, denotes the semiconductor material in which the source and drain regions are produced.

In the case of a transistor produced using silicon on insulator (SOI) technology, this substrate is a silicon film separated from the carrier substrate by a buried insulating layer. Following production of the transistor, a portion thereof remains under the gate, between the source and drain regions, in which portion the channel of the transistor may be formed.

According to one embodiment, the device is produced in a semiconductor substrate, and the first capacitor and the second capacitor each have an electrode produced in one and the same active zone of the semiconductor substrate and in a manner juxtaposed with a separate electrode semiconductor region of the main transistor, the first terminal being produced by contacting the drain semiconductor region of the main transistor.

The substrate is advantageously of silicon on insulator type.

Coupling the first terminal to the drain of the main transistor makes it possible to achieve sufficient reactivity of the integrated circuit to obtain the chaotic oscillations.

Furthermore, producing an electrode of each transistor in a manner juxtaposed with an electrode semiconductor region of the main transistor makes it possible to produce electrical connections without metal tracks, thereby allowing the flow of the charge carriers without them extracting silicon film, thus advantageously promoting interactions between the flows of these carriers.

The resistive element may have a resistance greater than one megaohm (1 MΩ).

The second control circuit may include a control resistor, or a control transistor whose control electrode is configured to receive a control signal, so as to modify the resistance of the drain-source connection of the control transistor.

According to another aspect, what is proposed is a system including at least one device such as described above.

The system may be a random counter including a plurality of flip-flops whose clock inputs are coupled to the output terminal of the at least one device.

The system may be a random number generator including a plurality of flip-flops, each flip-flop having a data input coupled to a separate device.

BRIEF DESCRIPTION OF THE DRAWINGS

Other advantages and features of the invention will become apparent upon examining the detailed description of wholly nonlimiting modes of implementation and embodiments of the invention and the appended drawings, in which:

FIGS. 1 to 6 illustrate embodiments of the invention.

DETAILED DESCRIPTION OF ILLUSTRATIVE EMBODIMENTS

Figure 1:
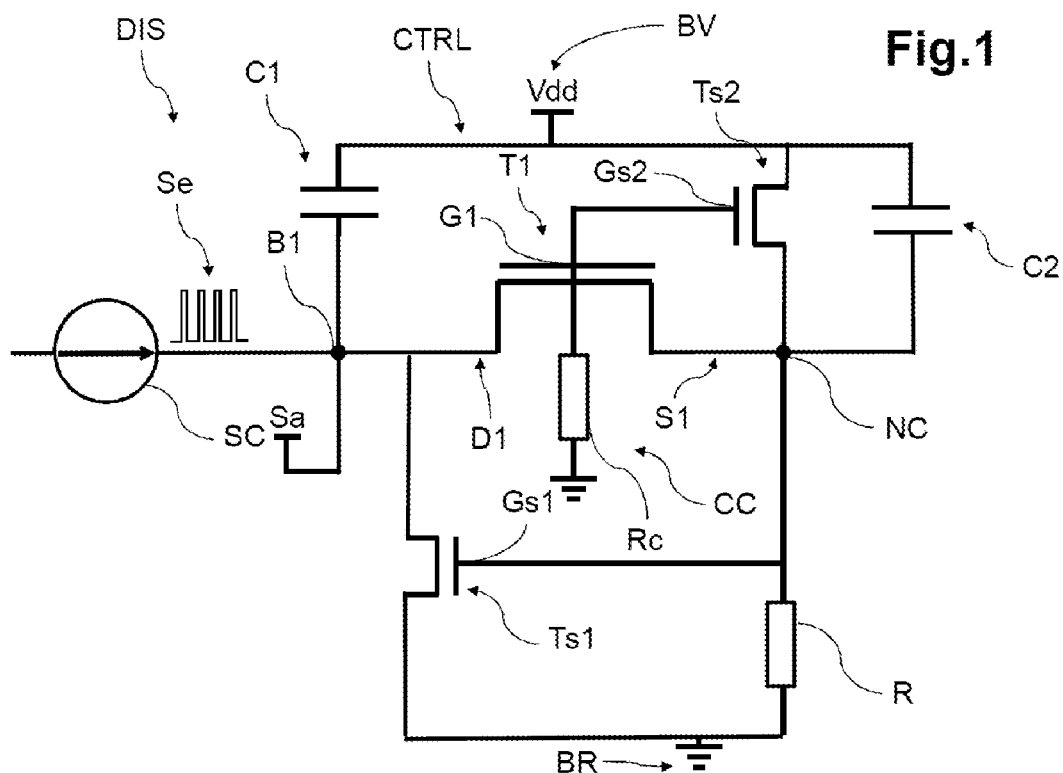

FIG. 1 schematically illustrates an integrated device DIS, for generating a random signal Sa, produced in and on a semiconductor substrate of silicon on insulator (SOI) type.

The device DIS includes a first terminal B1, intended to receive a first signal Se, in this case a current pulse train, and to emit the random signal Sa. The device DIS also includes a supply terminal BV intended to receive a supply voltage Vdd, in this case with a value of one volt, and a reference terminal BR intended to receive a reference voltage, for example ground in this case.

The device DIS includes a current source SC, configured to generate the first signal Se, and a first control circuit CTRL, configured to convert the current pulses into a voltage signal randomly having pulses greater than a threshold.

The first control circuit CTRL in this case includes a first capacitor C1 coupled between the first terminal B1 and the supply terminal BV, and configured to receive and integrate the input signal Se. The first capacitor C1 is a MOS capacitor, and therefore does not exhibit linear behavior.

Figure 2:
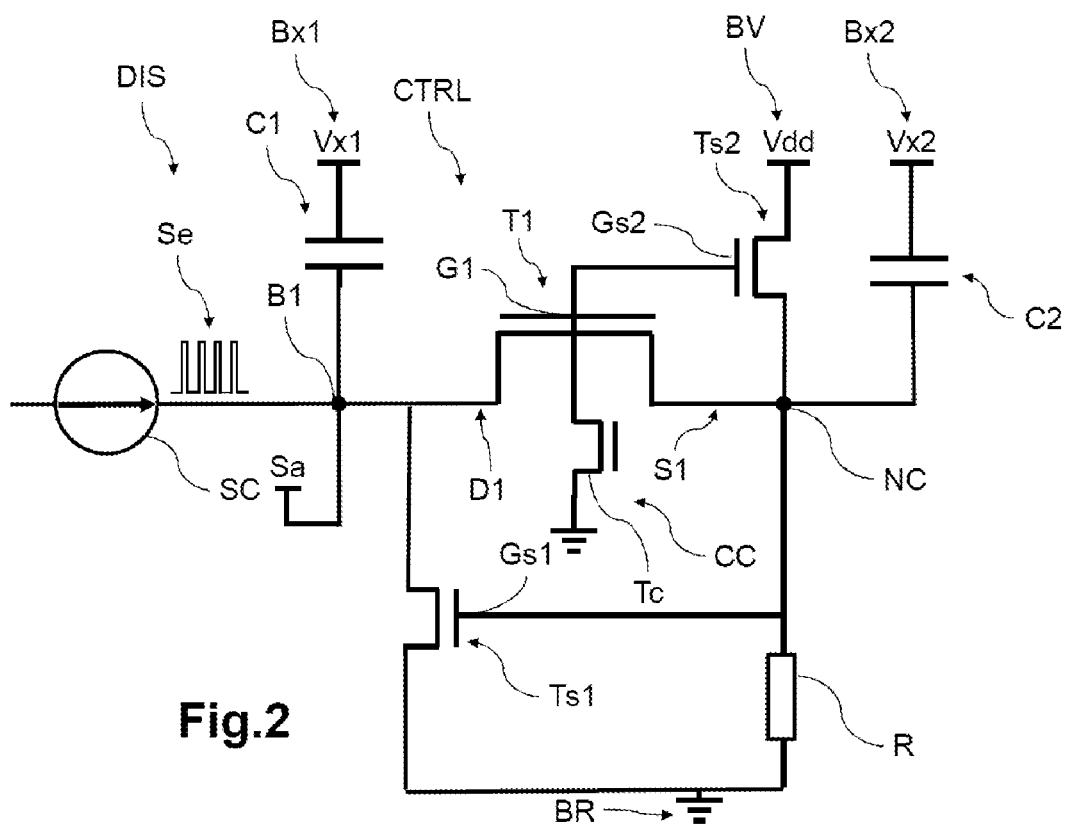

It would nevertheless be possible, as illustrated in FIG. 2, for the first capacitor C1 to be coupled between the first terminal B1 and a first auxiliary terminal Bx1 delivering a first auxiliary voltage Vx1 that is different from the supply voltage Vdd.

A second capacitor C2 is, in this case, coupled between a common node NC of the first control circuit CTRL and the supply terminal BV. The second capacitor C2 is a MOS capacitor, and therefore does not exhibit linear behaviour.

It would nevertheless be possible, as illustrated in FIG. 2, for the second capacitor C2 to be coupled between the common node NC and a second auxiliary terminal Bx2 delivering a second auxiliary voltage Vx2 that is different from the supply voltage Vdd.

A first secondary transistor Ts1, whose gate Gs1 is coupled to the common node NC, is coupled between the first terminal B1 and the reference terminal BR and is configured, in the on state, to disable the first MOS capacitor C1.

A second secondary transistor Ts2, coupled between the supply terminal BV and the common node, is configured, in the on state, to short-circuit the second capacitor C2.

The device DIS furthermore includes a main MOS transistor T1 of which a first electrode semiconductor region, in this case its drain D1, is coupled to the first terminal B1, a second electrode semiconductor region, in this case its source S1, is coupled to the common node NC and whose gate G1 is coupled to the gate Gs2 of the second auxiliary transistor Ts2.

The substrate sb1 of the main transistor T1 is electrically coupled to the gate G1.

The main MOS transistor T1 includes a parasitic bipolar transistor, whose base is the substrate sb1 of the MOS transistor, whose collector is the drain D1 and whose emitter is the source S1.

In this case, the main MOS transistor has a gate width of about three-hundred nanometres and a gate length (drain-source distance) of about twenty-eight nanometres.

The first control circuit CTRL furthermore includes a resistive element, in this case a resistor R, coupled between the common node NC and the reference terminal BR, with a value of one gigaohm (1 G$\Omega$) for example.

It would nevertheless be possible for the resistive element to be an NMOS transistor whose gate is biased so as to obtain a resistance of the drain-source connection of the NMOS transistor of equal to one gigaohm (1 G$\Omega$), for example.

A second control circuit CC is coupled between the substrate sb1 and the reference terminal BR and is configured to adjust the value of the triggering threshold of the main transistor T1.

In this case, the second control circuit CC includes a control resistor Rc with a value of one gigaohm (1 G$\Omega$) for example.

It would nevertheless be possible, as illustrated in FIG. 2, for the second control circuit CC to include a control transistor Tc whose control electrode is configured to receive a control signal, so as to modify the resistance of the drain-source connection of the control transistor Tc.

FIG. 3 illustrates the operation of the device DIS, and, in particular, the evolution of the potential at the first terminal B1 (e.g. voltage as a function of time), that is to say the evolution of an integrated signal Si whose pulses form the random signal Sa, the evolution of the voltage Snc at the common node NC, and of the voltage Sg1 on the gate G1 of the main transistor T1.

During operation of the device DIS, the first terminal B1 in this case receives a series of current pulses that form the input signal Se.

Thus, in the presence of the input signal Se on the first terminal B, the first MOS capacitor C1 charges, and the potential on the first terminal B1 (the integrated signal Si) increases substantially linearly.

When the integrated signal Si, that is to say the potential on the first terminal B1, reaches the triggering threshold, then the integrated signal Si is transmitted on the gate g1 of the first transistor T1 by way of the drain-substrate capacitances and the drain-gate capacitances of the first transistor T1 and by way of the leakage currents of the drain-substrate junction on the substrate sb1 of the first transistor T1. The presence of the drain-substrate capacitance of the transistor T1, as well as the connection between the substrate sb1 and the gate of the transistor T1, makes it possible to obtain operation of the MOS transistor in subthreshold mode, combined with operation of the intrinsic bipolar transistor.

The transistor T1 therefore possesses hybrid operation. Such transistors are well known to those skilled in the art, who may refer, for all purposes, for example, to international patent application WO 2011 089179.

Furthermore, these combined effects amplify one another mutually. Specifically, the connection between the gate G1 and the substrate sb1 enables the gate G1 to bias to a greater extent (by way of the drain-gate capacitance but also by way of the bias of the substrate sb1) than through the simple drain-gate coupling and, as a result, also makes it possible to amplify these combined effects, since the closer the gate voltage gets to the threshold voltage of the MOS transistor, the more the current gain of the parasitic bipolar transistor increases.

Moreover, the higher the product of the resistance of the control resistor Rc and the capacitance of the drain-substrate capacitance, the lower the value of the triggering threshold.

The use of a hybrid operation transistor is particularly advantageous as it makes it possible to obtain a low triggering threshold, for example of the order of one volt.

Moreover, the voltage across the terminals of the first capacitor C1 firstly increases substantially linearly and incrementally.

Additionally, with the first capacitor C1 being a MOS capacitor, beyond a certain voltage threshold TH at the first terminal B1 of the MOS capacitor C1, in this case 0.6 volts, the voltage increments no longer increase substantially linearly, but have the form of high-amplitude voltage pulses IMP of the order of one to a few volts.

When the integrated signal Si reaches the triggering threshold of the main transistor T1, in this case 0.6 volts, the main MOS transistor T1 triggers, the capacitor C1 discharges partially through the MOS transistor T1 to the common node NC, and the gate G1 of the main transistor T1 is biased for a very brief duration.

This brief bias is transmitted directly to the gate Gs2 of the second secondary transistor Ts2 and makes it possible to couple the common node NC briefly to the supply terminal BV through the secondary MOS transistor Ts2.

The voltage Snc at the common node therefore increases, without however reaching the supply voltage Vdd, firstly under the effect of the coupling to the supply terminal BV through the second secondary MOS transistor Ts2 and secondly under the effect of the coupling to the first terminal B1 through the main transistor T1.

The increase in the voltage at the common node NC makes it possible to bias the gate Gs1 of the first secondary transistor Ts1.

Thus, the secondary transistor Ts1 is in the on state, and the first capacitor C1 partially discharges therethrough.

Since the voltage Snc at the common node NC increases, and the potential at the first terminal B1 decreases, the direction of the current flowing through the main transistor T1 may reverse intermittently.

Furthermore, due to the coupling between the various points of the circuit (some instances of which will be detailed hereinafter), to the pulse generation on the first terminal B1, and to the very brief duration of the events due to the high reactivity of the first control circuit CTRL, the voltage Sa on the first terminal B1 and the voltage Snc across the terminals of the second capacitor C2 vary chaotically.

More precisely, there is a chaotic oscillation of the charges between the two capacitors C1 and C2, through the main transistor T1, leading to the random nature of the signal Sa.

Furthermore, if the value of the charge at the terminals of the first MOS capacitor C1 is such that the first MOS capacitor C1 has reached its depletion regime, and that the MOS capacitor C1 is not able to discharge due to the bias conditions of the first control circuit CTRL, the current pulses of the first signal Se bring about a very large rise in the potential at the first terminal B1, in the form of voltage pulses IMP greater than the threshold TH, in this case equal to 0.6 volts.

These pulses of the integrated signal Si, which depend on the bias conditions of the first control circuit CTRL at a given instant, therefore appear randomly and form the random signal Sa.

The device DIS thus makes it possible to generate a signal that contains a high random component, and exhibits reduced power consumption, since it operates with low voltages.

Furthermore, it should be noted that this random behaviour depends in particular on the value of the resistor R.

Thus, if the value of the resistor R is too low, for example a value of one megaohm, then the chaotic behaviour of the device is disabled.

By way of indication, the minimum value of the resistor R for obtaining random behaviour of the device is in this case one gigaohm.

As illustrated in FIG. 4, which is a sectional view of part of the device DIS, the main transistor T1, the first capacitor C1 and the second capacitor C2 are produced in and on one and the same active zone ZA, which includes a first semiconductor film 1 (substrate) produced on a buried semiconductor layer 2, commonly referred to by those skilled in the art under the acronym BOX ('Buried OXide') and itself produced on a carrier substrate 3.

Such a substrate 1 is of silicon on insulator (SOI) type, as it is well known to those skilled in the art.

The gate G1 of the main transistor T1, a first electrode E11 of the first capacitor C1, and a first electrode E21 of the second capacitor C2 are traditionally produced by etching of an oxide layer formed on the semiconductor film 1 and of a polysilicon layer produced on the oxide layer.

The gate G1 of the main transistor T1, which gate is situated on the semiconductor film 1, includes a polysilicon line 40 situated on a thin gate oxide layer 41.

The source S1 and drain D1 semiconductor regions are produced on either side of the gate G1 by doping the semiconductor film 1.

The first capacitor C1 is situated next to the main transistor T1 and includes a thin oxide layer 410 situated on the semiconductor film 1, which forms the dielectric of the first capacitor C1 and on which there is situated a polysilicon layer that forms a first electrode E11 of the first capacitor C1.

A second electrode E12 of the first capacitor C1 includes that portion of the semiconductor film 1 that is situated under the first electrode E11 of the first capacitor C1, and is juxtaposed with the drain region D1.

The second capacitor C2 is situated next to the main transistor T1, on the side opposite the first capacitor C1, and includes a thin oxide layer 411 situated on the semiconductor film 1, which forms the dielectric of the second capacitor C2 and on which there is situated a polysilicon layer that forms a first electrode E21 of the second capacitor C2.

A second electrode E22 of the second capacitor C2 includes that portion of the semiconductor film 1 that is situated under the first electrode E21 of the second capacitor C2, and is juxtaposed with the source region Si.

The coupling between the second electrode E12 of the first capacitor C1 and the drain region D1, as well as the coupling of the second electrode E22 of the second capacitor C2, are thus not produced by way of vias and metal tracks, but directly by juxtaposing the corresponding regions in the semiconductor film 1. This advantageously allows the flows of charge carriers to interact.

Moreover, the first terminal B1 is produced on the drain semiconductor region D1 of the main transistor T1.

Specifically, if the first terminal B1 were to be produced in the semiconductor film 1, but beyond the first electrode E11 of the first capacitor C1, that is to say on the side opposite the drain region D1, then the flows of electrons flowing between the second capacitor C2 and the output input terminal B1 would have to flow through the second electrode E12 to reach the output input terminal. Due to the resistance of the silicon film 1, this would lead to an excessively high inertia of the device DIS, thus preventing its chaotic operation.

The arrangement of these elements of the integrated circuit therefore makes it possible to obtain an integrated circuit having high reactivity, and therefore enables the chaotic oscillations of the charges between the first capacitor C1 and the second capacitor C2.

The device DIS described above in connection with FIGS. 1 to 4 may be integrated into any system requiring a random signal generator.

Figure 5:
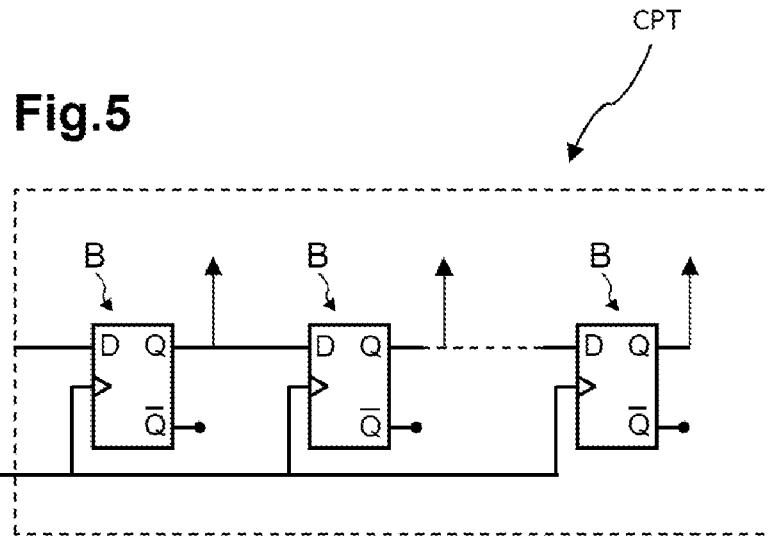

In particular, FIG. 5 illustrates a random counter CPT, including a plurality of flip-flops B whose clock input is coupled to a device DIS such as described above in connection with FIGS. 1 to 4.

Figure 6:
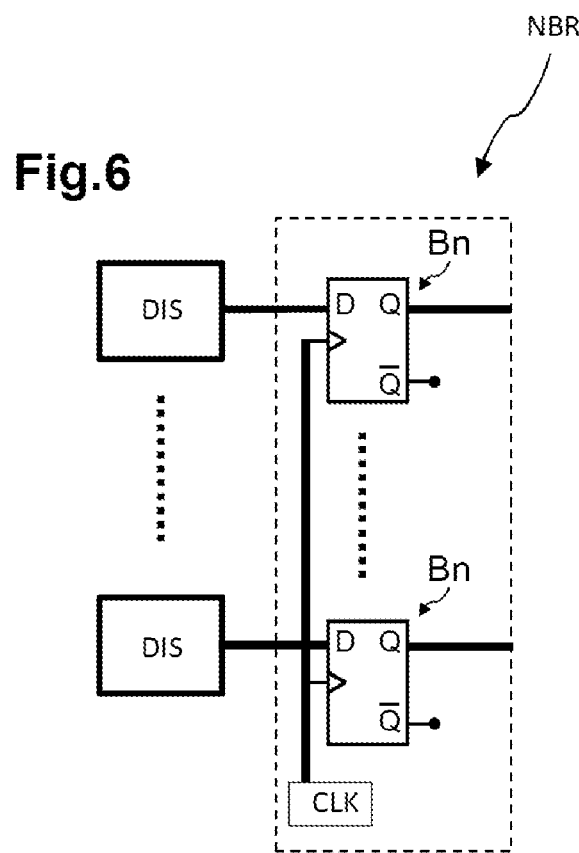

FIG. 6 illustrates a random number generator NBR including a plurality of flip-flops Bn, each flip-flop having its data input coupled to a separate device DIS and its clock input coupled to a clock generator common to all of the flip-flops.

What is claimed is:

1. An integrated device for generating a random signal, the integrated device comprising:
 a first terminal;
 a pulse signal generator configured to generate a current pulse train on the first terminal; and
 a first control circuit coupled to the first terminal and configured to convert the current pulse train into a voltage signal randomly comprising voltage pulses greater than a threshold, the random signal containing the voltage pulses greater than the threshold, wherein the integrated device is configured to receive the current pulse train at the first terminal and generate the random signal at the first terminal.

2. The integrated device according to claim 1, further comprising a supply terminal configured to receive a supply voltage, wherein the first control circuit comprises a first MOS capacitor coupled between a first auxiliary voltage terminal, configured to deliver a first auxiliary voltage, and the first terminal, and wherein the first MOS capacitor is configured to generate a voltage pulse greater than the threshold in a presence of a current pulse in response to the first MOS capacitor reaching a depletion regime, the first control circuit being configured to charge and discharge the first MOS capacitor randomly.

3. The integrated device according to claim 2, wherein the first auxiliary voltage terminal is the supply terminal, and wherein the first auxiliary voltage is the supply voltage.

4. The integrated device according to claim 2, further comprising a reference terminal configured to receive a reference voltage.

5. The integrated device according to claim 4, wherein the first control circuit further comprises:
 a main transistor coupled between the first terminal and a common node, wherein a substrate of the main transistor is coupled to the reference terminal by way of a second control circuit, and wherein the substrate of the main transistor is directly coupled to a gate of the main transistor;
 a second MOS capacitor coupled between the common node and a second auxiliary supply terminal configured to deliver a second auxiliary voltage;
 a first secondary transistor coupled between the first terminal and the reference terminal, wherein a gate of the first secondary transistor is coupled to the common node;
 a second secondary transistor coupled between the supply terminal and the common node, wherein a gate of the second secondary transistor is coupled to the gate of the main transistor; and
 a resistive element coupled between the common node and the reference terminal.

6. The integrated device according to claim 5, wherein the second auxiliary supply terminal is the supply terminal, and wherein the second auxiliary voltage is the reference voltage.

7. The integrated device according to claim 5, wherein the integrated device is disposed in a semiconductor substrate, and wherein an electrode of the first MOS capacitor and an electrode of the second MOS capacitor are produced in a same active zone of the semiconductor substrate.

8. The integrated device according to claim7, wherein the electrode of the first MOS capacitor and the electrode of the second MOS capacitor are spatially juxtaposed with respective electrode semiconductor regions of the main transistor, the respective electrode semiconductor regions comprising a drain semiconductor region and a source semiconductor region, and wherein the first terminal contacts the drain semiconductor region of the main transistor.

9. The integrated device according to claim7, wherein the semiconductor substrate is of a silicon-on-insulator type.

10. The integrated device according to claim5, wherein the resistive element has a resistance greater than one megaohm.

11. The integrated device according to claim5, wherein the second control circuit comprises a control resistor.

12. The integrated device according to claim5, wherein the second control circuit comprises a control transistor comprising a control electrode configured to receive a control signal so as to modify a resistance of a drain-source connection of the control transistor.

13. The integrated device according to claim 1, wherein the first control circuit comprises a main transistor, a first MOS capacitor, and a second MOS capacitor disposed over a buried oxide layer of a semiconductor substrate.

14. The integrated device according to claim 13, wherein a first plate of the first MOS capacitor is coupled to a supply terminal configured to receive a supply voltage, a first plate of the second MOS capacitor is coupled to the supply terminal, a second plate of the first MOS capacitor is coupled to a drain of the main transistor and the first terminal, a second plate of the second MOS capacitor is coupled to a source of the main transistor.

15. The integrated device according to claim 13, wherein the integrated device is disposed in the semiconductor substrate, and wherein an electrode of the first MOS capacitor and an electrode of the second MOS capacitor are produced in a same active zone of the semiconductor substrate.

16. A system comprising:
 at least one integrated device for generating a random signal, the at least one integrated device comprising:
 a first terminal;
 a pulse signal generator configured to generate a current pulse train on the first terminal; and
 a first control circuit coupled to the first terminal and configured to convert the current pulse train into a voltage signal randomly comprising voltage pulses greater than a threshold, the random signal containing the voltage pulses greater than the threshold, the system being a random counter comprising a plurality of flip-flops having clock inputs coupled to the first terminal of the at least one integrated device.

17. The system according to claim 16, wherein the first control circuit comprises a main transistor, a first MOS capacitor, and a second MOS capacitor disposed over a buried oxide layer of a semiconductor substrate, and wherein an electrode of the first MOS capacitor and an electrode of the second MOS capacitor are produced in a same active zone of the semiconductor substrate.

18. A system comprising:
   at least one integrated device for generating a random signal, the at least one integrated device comprising:
   a first terminal;
   a pulse signal generator configured to generate a current pulse train on the first terminal;
   a first control circuit coupled to the first terminal and configured to convert the current pulse train into a voltage signal randomly comprising voltage pulses greater than a threshold, the random signal containing the voltage pulses greater than the threshold; and
   a plurality of integrated devices, the system being a random number generator comprising a plurality of flip-flops, each flip-flop having a data input coupled to a respective integrated device of the plurality of integrated devices.

19. The system according to claim 18, wherein the first control circuit comprises a main transistor, a first MOS capacitor, and a second MOS capacitor disposed over a buried oxide layer of a semiconductor substrate, and wherein an electrode of the first MOS capacitor and an electrode of the second MOS capacitor are produced in a same active zone of the semiconductor substrate.

20. An integrated device for generating a random signal, the integrated device comprising:
   a first terminal;
   a supply terminal configured to receive a supply voltage
   a pulse signal generator configured to generate a current pulse train on the first terminal;
   a first control circuit coupled to the first terminal and configured to convert the current pulse train into a voltage signal randomly comprising voltage pulses greater than a threshold, the random signal containing the voltage pulses greater than the threshold, wherein the first control circuit comprises a first MOS capacitor coupled between a first auxiliary supply terminal configured to deliver a first auxiliary voltage and the first terminal;
   a main transistor coupled between the first terminal and a common node, wherein a substrate of the main transistor is coupled to a reference terminal, configured to receive a reference voltage, by way of a second control circuit, and wherein the substrate of the main transistor is directly coupled to a gate of the main transistor;
   a second MOS capacitor coupled between the common node and a second auxiliary supply terminal configured to deliver a second auxiliary voltage;
   a first secondary transistor coupled between the first terminal and the reference terminal, wherein a gate of the first secondary transistor is coupled to the common node;
   a second secondary transistor coupled between the supply terminal and the common node, wherein a gate of the second secondary transistor is coupled to the gate of the main transistor; and
   a resistive element coupled between the common node and the reference terminal.

21. The integrated device according to claim 20, wherein the integrated device is disposed in a semiconductor substrate, and wherein an electrode of the first MOS capacitor and an electrode of the second MOS capacitor are disposed in a same active zone of the semiconductor substrate.

22. The integrated device according to claim 21, wherein the electrode of the first MOS capacitor and the electrode of the second MOS capacitor are spatially adjacent to respective electrode semiconductor regions of the main transistor, the respective electrode semiconductor regions comprising a drain semiconductor region and a source semiconductor region, and wherein the first terminal contacts the drain semiconductor region of the main transistor.

23. The integrated device according to claim 20, wherein the first MOS capacitor is configured to generate a voltage pulse greater than the threshold in a presence of a current pulse in response to the first MOS capacitor reaching a depletion regime, the first control circuit being configured to charge and discharge the first MOS capacitor randomly.

24. The integrated device according to claim 20, wherein the resistive element has a resistance greater than one megaohm.

* * * * *